(12) United States Patent
Hirota

(10) Patent No.: US 7,759,796 B2
(45) Date of Patent: Jul. 20, 2010

(54) SEMICONDUCTOR DEVICE WITH TWO BARRIER LAYERS FORMED BETWEEN COPPER-CONTAINING LINE LAYER AND ALUMINUM-CONTAINING CONDUCTIVE LAYER

(75) Inventor: Jun Hirota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/126,284

(22) Filed: May 23, 2008

(65) Prior Publication Data
US 2008/0296769 A1 Dec. 4, 2008

(30) Foreign Application Priority Data
May 24, 2007 (JP) .............................. 2007-137910

(51) Int. Cl.
*H01L 23/532* (2006.01)
(52) U.S. Cl. .................. 257/751; 257/758; 257/762; 257/E23.16; 257/E23.161
(58) Field of Classification Search ........... 257/E23.158
See application file for complete search history.

(56) References Cited

U.S. PATENT DOCUMENTS

| | | | |
|---|---|---|---|
| 6,207,568 B1 * | 3/2001 | Liu et al. | 438/688 |
| 2006/0163732 A1 * | 7/2006 | Cunningham | 257/751 |
| 2006/0202346 A1 * | 9/2006 | Shih et al. | 257/774 |
| 2007/0222068 A1 * | 9/2007 | Yamada | 257/734 |
| 2008/0083990 A1 * | 4/2008 | Hatazaki et al. | 257/751 |

FOREIGN PATENT DOCUMENTS

| | | |
|---|---|---|
| JP | 2006-253666 | 9/2006 |
| JP | 2007-042662 | 2/2007 |

* cited by examiner

*Primary Examiner*—Stephen W Smoot
(74) *Attorney, Agent, or Firm*—Finnegan, Henderson, Farabow, Garrett & Dunner, L.L.P.

(57) ABSTRACT

A semiconductor device according to an embodiment of the present invention includes a line layer containing Cu (copper), an inter layer dielectric formed on the line layer, a via hole formed in the inter layer dielectric on the line layer, a first barrier layer formed on the line layer in the via hole, a second barrier layer formed on the first barrier layer and on a sidewall of the via hole, and a conductive layer formed on the second barrier layer and containing Al (aluminum).

7 Claims, 13 Drawing Sheets

SEMICONDUCTOR DEVICE WITH TWO BARRIER LAYERS FORMED BETWEEN COPPER-CONTAINING LINE LAYER AND ALUMINUM-CONTAINING CONDUCTIVE LAYER

CROSS REFERENCE TO RELATED APPLICATIONS

This application is based upon and claims the benefit of priority from the prior Japanese Patent Application No. 2007-137910, filed on May 24, 2007, the entire contents of which are incorporated herein by reference.

BACKGROUND OF THE INVENTION

1. Field of the Invention

The present invention relates to a semiconductor device and a method of manufacturing the same.

2. Background Art

In recent years, multilayer interconnects of semiconductor devices have been required to provide high integration density and low resistance. Conventionally, Al (aluminum) line layers have been frequently adopted as line layers of semiconductor devices. However, in recent years, a growing number of Cu (copper) line layers have become adopted as line layers of semiconductor devices, to improve margins for fabrication of lines and to further lower the resistance of lines.

In this case, a combination of a Cu line layer and an Al via plug layer is considered to be effective in terms of cost reductions. However, the combination of a Cu line layer and an Al via plug layer has problems as described below.

First, there is a problem concerning barrier break of a barrier metal layer formed between a Cu line layer and an Al via plug layer by sputtering. In other words, there is a problem that a barrier metal layer is not correctly formed by sputtering in some cases. This barrier break tends to occur in the vicinity of the edge between the bottom surface and the side surface of a via hole, and particularly in a peripheral portion of a wafer. This is because, in general, the coverage of a barrier metal layer is bad in the vicinity of the edge of a via hole. If the barrier break occurs in a case that the combination of a Cu line layer and an Al via plug layer is adopted, Cu in the Cu line layer diffuses into the Al via plug layer. If such diffusion occurs, voids occur in the Cu line layer and a disconnection occurs between the Cu line layer and the Al via plug layer.

Second, unburying (unfilling) of the Al via plug layer is a problem. Unburying of the Al via plug layer tends to occur when the aspect ratio of a via hole increases.

It is difficult to prevent the barrier break and the unburying at the same time. The barrier break can be prevented by increasing the thickness of the barrier metal layer. However, if the thickness of the barrier metal layer is increased, the amount of an overhang of the barrier metal layer at the opening of the via plug increases, and the unburying of the Al via plug layer tends to occur. On the contrary, if the thickness of the barrier metal layer is decreased, the coverage in the vicinity of the edge of a via hole becomes worse, and the barrier break tends to occur. If the aspect ratio of a via hole becomes larger than 2, it becomes very difficult to prevent the barrier break and the unburying at the same time. For example, when the height of the via hole is 300 nm, it becomes very difficult to prevent the barrier break and the unburying at the same time in a case that the diameter of the via hole becomes larger than 150 nm.

JP-A 2006-253666 (KOKAI) discloses a semiconductor device including a Cu line layer and a Cu via plug layer between which a CoWP cap metal layer, a cap metal nitride layer, and a barrier metal layer containing Ta are provided. JP-A 2007-42662 (KOKAI) discloses a semiconductor device including a Cu line layer and an Al via plug layer between which a barrier metal layer containing Ti is provided.

SUMMARY OF THE INVENTION

An embodiment of the present invention is, for example, a semiconductor device including a line layer containing Cu (copper), an inter layer dielectric formed on the line layer, a via hole formed in the inter layer dielectric on the line layer, a first barrier layer formed on the line layer in the via hole, a second barrier layer formed on the first barrier layer and on a sidewall of the via hole, and a conductive layer formed on the second barrier layer and containing Al (aluminum).

Another embodiment of the present invention is, for example, a method of manufacturing a semiconductor device, the method including forming a line layer containing Cu (copper), forming a first barrier layer on the line layer, forming an inter layer dielectric on the line layer after forming the first barrier layer, forming a via hole in the inter layer dielectric on the line layer so that a top surface of the first barrier layer is exposed, forming a second barrier layer on the first barrier layer and on a sidewall of the via hole, and forming a conductive layer containing Al (aluminum) on the second barrier layer.

DESCRIPTION OF THE EMBODIMENTS

First Embodiment

Figure 1:
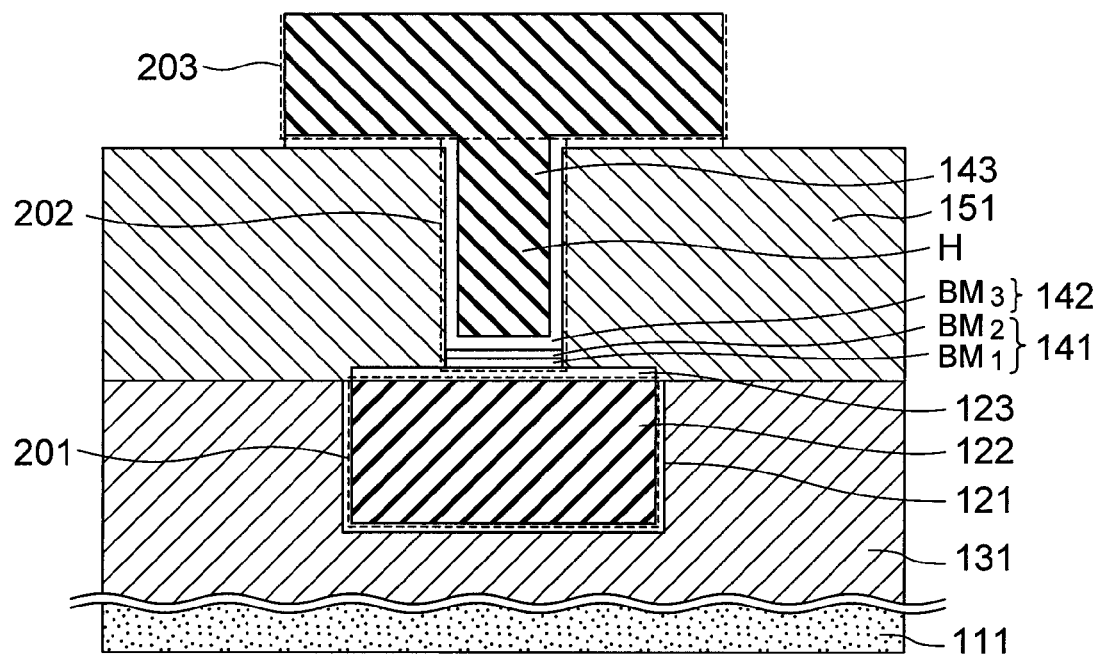
FIG. 1 is a side sectional view of a semiconductor device of a first embodiment.

FIG. 1 is a side sectional view of a semiconductor device 101 of the first embodiment. The semiconductor device 101 includes a substrate 111, a barrier metal layer 121, a Cu line layer 122, a protective layer 123, a first inter layer dielectric 131, a first barrier metal layer 141, a second barrier metal layer 142, an Al conductive layer 143, and a second inter layer dielectric 151. The Cu line layer 122 constitutes a first line layer 201, which is a Cu line layer. The first barrier metal layer 141, the second barrier metal layer 142, and the Al conductive layer (Al via plug layer) 143 constitute a via plug 202. The Al conductive layer 143 further constitutes a second line layer 203, which is an Al line layer. The first line layer 201 and the second line layer 203 are electrically connected by the via plug 202. The first line layer 201 corresponds to a lower line layer of the via plug 202, and the second line layer 203 corresponds to an upper line layer of the via plug 202.

The substrate 111 in this embodiment is an Si (silicon) substrate. The substrate 111 may be a semiconductor substrate or an SOI (Silicon On Insulator) substrate. The semiconductor device 101 includes, for example, semiconductor elements such as transistors and capacitors, which are formed on the substrate 111.

The barrier metal layer 121 is formed above the substrate 111. The barrier metal layer 121 in this embodiment is a Ta layer containing Ta (tantalum) atoms. The Ta layer has an effect of preventing the diffusion of Cu atoms contained in the Cu line layer 122. The barrier metal layer 121 may be, for example, a Ti layer containing Ti (titanium) atoms. The barrier metal layer 121 may be, for example, an alloy layer containing Ta atoms and Ti atoms. The barrier metal layer 121 may be a single layer including one layer or a stacked layer including two or more layers.

The Cu line layer 122 is formed on the barrier metal layer 121 via a seed layer. The Cu line layer 122 in this embodiment is a Cu layer containing Cu (copper) atoms, and is formed by electrolytic plating. The Cu line layer 122 in this embodiment is a damascene line layer. The Cu line layer 122 may be a single damascene line layer or a dual damascene line layer.

The protective layer 123 is formed at least on the Cu line layer 122. The protective layer 123 has an effect of protecting the Cu line layer 122, and covers at least a top surface of the Cu line layer 122. The protective layer 123 in this embodiment is a CoWB (cobalt tungsten boron) layer having an effect of suppressing the oxidation of Cu atoms contained in the Cu line layer 122. The CoWB layer can be selectively formed on the Cu line layer 122 and can suppress oxidation damage to the Cu line layer 122. The protective layer 123 may be, for example, a Co layer, a CoW layer, a CoP layer, a CoWP layer, a CoSnP layer or a CoMoP layer (Co: cobalt, W: tungsten, P: phosphorus, Sn: tin, Mo: molybdenum). The protective layer 123 may be a single layer including one layer or a stacked layer including two or more layers.

The first inter layer dielectric 131 is formed above the substrate 111, and provides a base that supports the first line layer 201. The first inter layer dielectric 131 in this embodiment is a TEOS layer. The first inter layer dielectric 131 may be, for example, an $SiO_2$ (silicon dioxide) layer or a low-permittivity (low-k) layer. The low-permittivity layer may be an inorganic layer or an organic layer.

The first barrier metal layer 141 is formed on the protective layer 123 before forming a via hole H for the via plug 202. Therefore, the first barrier metal layer 141 is formed between a top surface of the protective layer 123 and a bottom surface of the Al conductive layer 143, but is not formed between a side surface of the via hole H and a side surface of the Al conductive layer 143. The first barrier metal layer 141 in this embodiment is a stacked layer including two layers. The first barrier metal layer 141 in this embodiment includes a Ti layer $BM_1$ containing Ti (titanium) atoms, and a TiN layer $BM_2$ containing Ti (titanium) atoms and N (nitrogen) atoms. The TiN layer $BM_2$ has an effect of preventing the diffusion of Cu atoms contained in the Cu line layer 122 and Al atoms contained in the Al conductive layer 143. A TiO layer containing Ti (titanium) atoms and O (oxygen) atoms may be provided between the Ti layer $BM_1$ and the TiN layer $BM_2$. The presence of the TiO layer increases the effect of preventing the diffusion of Cu atoms contained in the Cu line layer 122 and Al atoms contained in the Al conductive layer 143. The first barrier metal layer 141 may be a single layer including one layer or a stacked layer including two or more layers.

The second barrier metal layer 142 is formed on the first barrier metal layer 141 after forming the via hole H for the via plug 202. Therefore, the second barrier metal layer 142 is formed between the top surface of the protective layer 123 and the bottom surface of the Al conductive layer 143, and between the side surface of the via hole H and the side surface of the Al conductive layer 143. The second barrier metal layer 142 in this embodiment is a single layer including one layer. The second barrier metal layer 142 in this embodiment includes a Ti layer $BM_3$ containing Ti (titanium) atoms. The Ti layer $BM_3$ has an effect of improving the wettability of Al. The second barrier metal layer 142 may be a single layer including one layer or a stacked layer including two or more layers.

The Al conductive layer 143 corresponds to the main body of the via plug 202, and is formed on the second barrier metal layer 142 after forming the via hole H for the via plug 202. The Al conductive layer 143 in this embodiment is an Al layer containing Al (aluminum) atoms. The Al conductive layer 143 may contain only Al atoms or may contain Al atoms and other atoms (i.e., Cu atoms). The Al conductive layer 143 in this embodiment serves as an Al via plug layer and an Al line layer.

The second inter layer dielectric 151 is formed on the first inter layer dielectric 131, and provides a base that supports the second line layer 203. The second inter layer dielectric 151 in this embodiment is a TEOS layer. The second inter layer dielectric 151 may be, for example, an $SiO_2$ (silicon dioxide) layer or a low-permittivity (low-k) layer. The low-permittivity layer may be an inorganic layer or an organic layer. As shown in FIG. 1, the second inter layer dielectric 151 and the first barrier metal layer 141 are formed on the Cu line layer 122 via the protective layer 123. The protective layer 123 in this embodiment is formed between the second inter layer dielectric 151 and the Cu line layer 122, and between the first barrier metal layer 141 and the Cu line layer 122. The via hole H is formed in the second inter layer dielectric 151 on the Cu line layer 122. The first barrier metal layer 141 is formed on the Cu line layer 122 in the via hole H. The second barrier metal layer 142 is formed on the first barrier metal layer 141 and on a sidewall of the via hole H.

FIGS. 2A to 2H illustrate a manufacturing process of the semiconductor device 101 in FIG. 1.

Figure 2A:
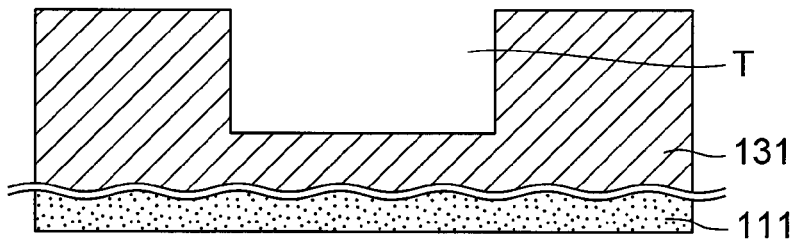
FIGS. 2A to 2H illustrate a manufacturing process of the semiconductor device of the first embodiment.

First, as shown in FIG. 2A, a first inter layer dielectric 131 is deposited above a substrate 111 by CVD. The substrate 111 in this case is a silicon substrate. The first inter layer dielectric 131 in this case is a TEOS layer. It is supposed that semiconductor elements such as transistors and capacitors are formed on the substrate 111. Next, a line trench T is formed on the surface of the first inter layer dielectric 131 by lithography and etching.

Figure 2B:
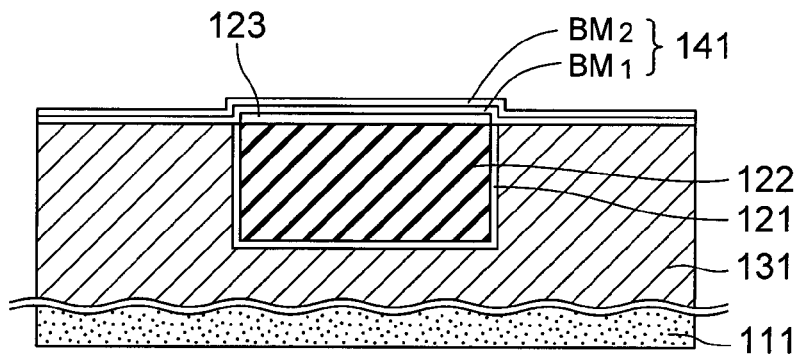

Next, as shown in FIG. 2B, a Ta layer 121 is deposited on the first inter layer dielectric 131 by sputtering. Consequently, the Ta layer (barrier metal layer) 121 is formed on a bottom surface and side surface of the line trench T. Next, a Cu seed layer is deposited on the Ta layer 121 by sputtering, and a Cu layer is deposited on the Cu seed layer by plating or the like. Consequently, a Cu line layer 122 is formed in the line trench T. Next, the Cu line layer 122 is planarized by CMP. In this way, a first line layer 201 buried in the line trench T is formed. Next, a CoWB layer 123 is selectively deposited on the Cu line layer 122 by plating or selective CVD. Consequently, the CoWB layer (protective layer) 123 is formed at least on a top surface of the Cu line layer 122. Next, a Ti layer $BM_1$ is deposited on the CoWB layer 123 and the first inter layer dielectric 131 by sputtering, and a TiN layer $BM_2$ is deposited on the Ti layer $BM_1$ by sputtering. In this way, a first barrier metal layer 141 (the Ti layer $BM_1$ and the TiN layer $BM_2$) is formed on the CoWB layer 123 and on the top surface of the first inter layer dielectric 131, before forming the via hole H for the via plug 202. The first barrier metal layer 141 is formed on the Cu line layer 122 via the CoWB layer 123.

Figure 2C:
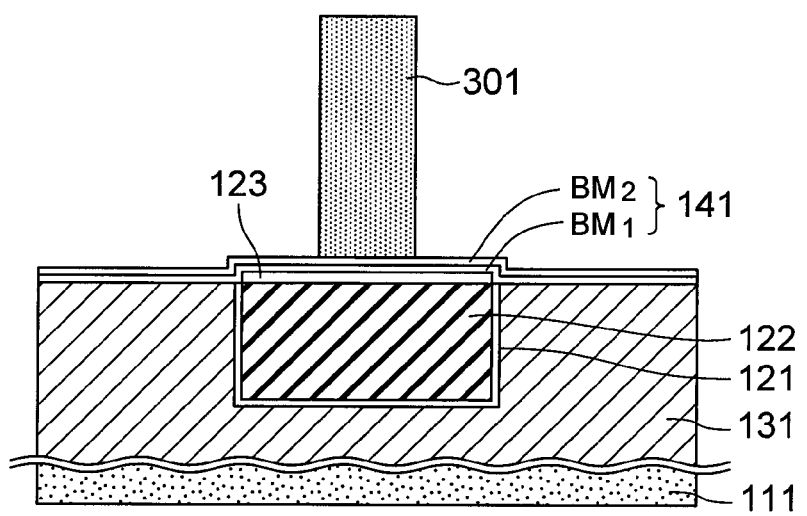

Next, a mask material 301 is deposited on the first barrier metal layer 141 by application. The mask material 301 can be selectively peeled off from the first barrier metal layer 141 and the first inter layer dielectric 131. The mask material 301 in this case is organic polyphenylene such as SiLK (registered trademark). The mask material 301 may be an SiN (silicon nitride) layer. Next, the heat treatment of the substrate 111 is performed at 100° C. to 400° C. Next, a resist pattern is formed on the mask material 301 by lithography. In the lithography, an inverted mask of a via hole pattern is used. Next, as shown in FIG. 2C, the mask material 301 is etched by RIE. In the etching, $O_2$ and $CH_4$ gas or $N_2$ and $H_2$ gas are used, for example.

Figure 2D:
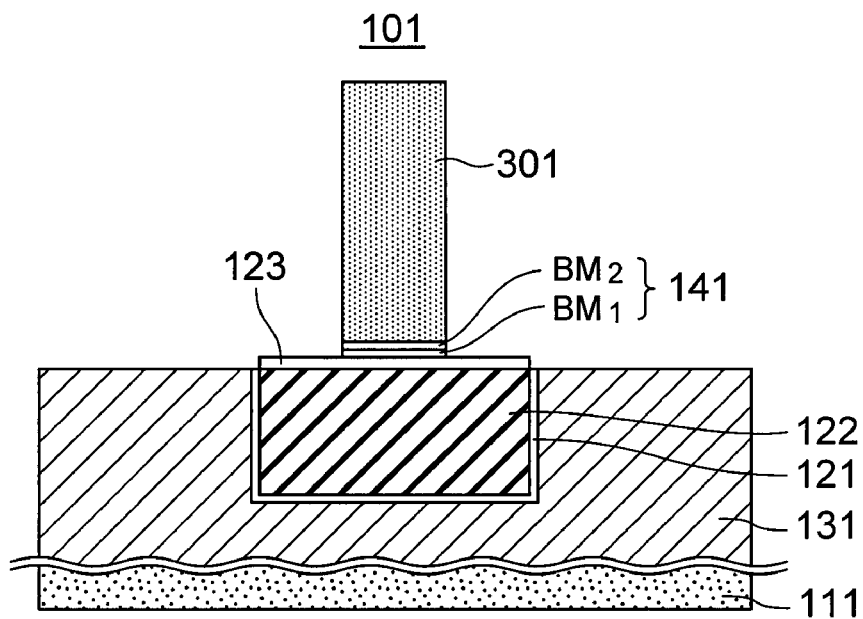

Next, as shown in FIG. 2D, the first barrier metal layer 141 is etched, and an ashing process is then performed. The etching is performed by ensuring a sufficient etching selectivity between the first barrier metal layer 141 and the CoWB layer 123. The ashing process is performed in an $O_2$ atmosphere at a temperature of 200° C. to 400° C. In this way, the first barrier metal layer 141 is partially removed, and a part of the first barrier metal layer 141 remains in a region where the via hole H is to be formed. In this embodiment, the CoWB layer 123 is provided mainly to suppress RIE damage to the Cu line layer 122 and to prevent oxidation of the Cu line layer 122 by the ashing process. Furthermore, the CoWB layer 123 has an effect of reducing line-to-line capacitance and suppressing poor electromigration of Cu. Next, etching reaction products (residues) of the mask material 301, the first barrier metal layer 141, and the CoWB layer 123 are removed with an inorganic or organic chemical liquid.

Figure 2E:
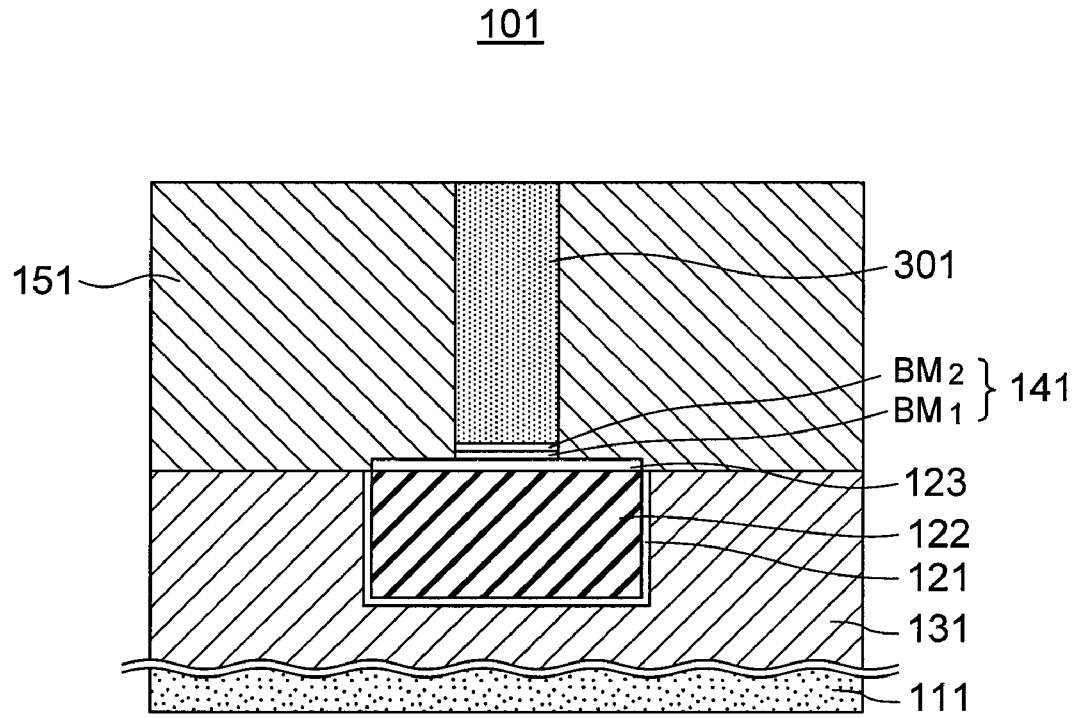

Next, as shown in FIG. 2E, a second inter layer dielectric 151 is deposited above the substrate 111 by CVD. Consequently, the second inter layer dielectric 151 is formed on the first inter layer dielectric 131 and the mask material 301. The second inter layer dielectric 151 in this case is a TEOS layer. The second inter layer dielectric 151 is formed on the Cu line layer 122 via the CoWB layer 123, after forming the first barrier metal layer 141. Next, the second inter layer dielectric 151 is planarized by etching. The second inter layer dielectric 151 is planarized until a top surface of the mask material 301 is exposed.

Figure 2F:
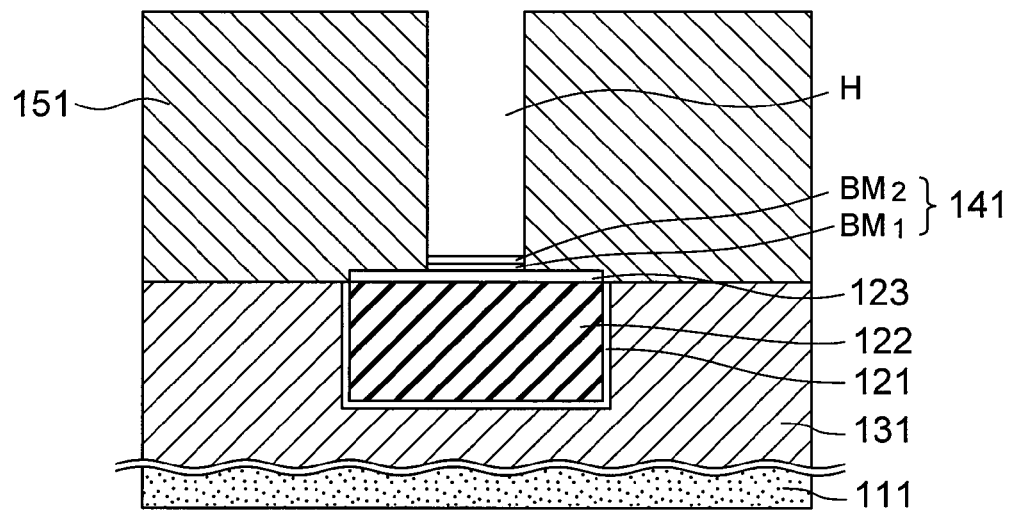

Next, as shown in FIG. 2F, the mask material 301 is removed by ashing. Consequently, there is provided a via hole H in which the top surface of the first barrier metal layer 141 (the top surface of the TiN layer $BM_2$) is exposed. The aching is performed at a pressure of 0.1 Pa to 500 Pa and a temperature of 200° C. to 400° C. The via hole H is formed in the second inter layer dielectric 151 on the Cu line layer 122, and a sidewall of the via hole H is constituted by the second inter layer dielectric 151. Next, etching reaction products (residues) of the mask material 301 and the second inter layer dielectric 151 are removed with an inorganic or organic chemical liquid.

Figure 2G:
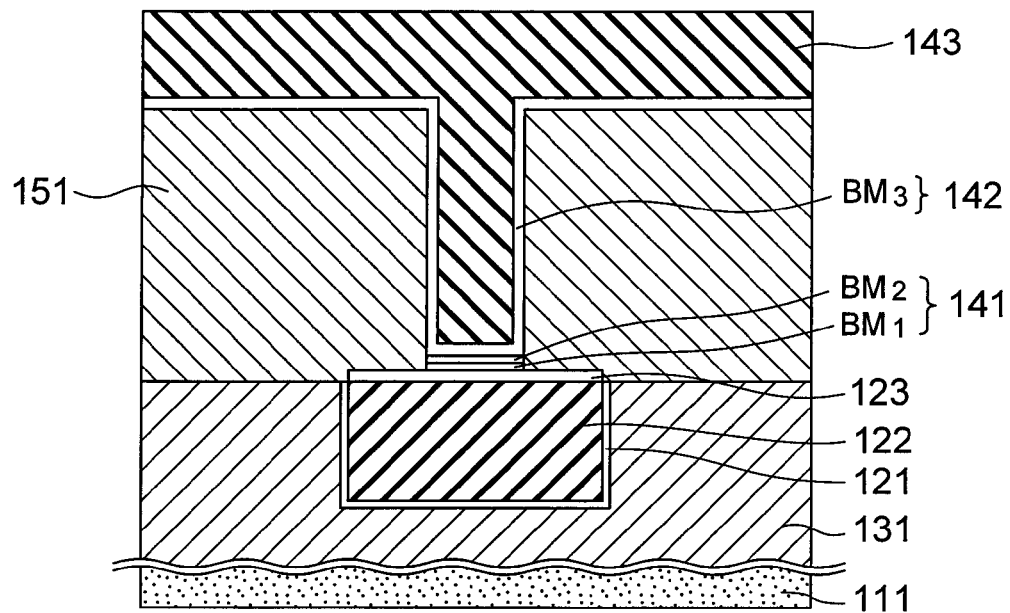

Next, as shown in FIG. 2G, a Ti layer $BM_3$ is deposited on the second inter layer dielectric 151 by sputtering. In this way, a second barrier metal layer 142 (Ti layer $BM_3$) is formed on the top surface of the first barrier metal layer 141 (the top surface of the TiN layer $BM_2$) and the sidewall of the via hole H. Effects of the Ti layer $BM_3$ is described below. First, the Ti layer $BM_3$ has an effect of improving wettability between the surface of the via hole H and Al. Due to the presence of the Ti layer $BM_3$, the interface energy between the surface of the via hole H and Al is lowered, and the agglomeration of Al is suppressed. Second, the Ti layer $BM_3$ has an effect of suppressing the white turbidity of the Al conductive layer 143. The white turbidity of the Al conductive layer 143 is suppressed because the top surface of the Al conductive layer 143 becomes a (111) plane due to the effect of the Ti layer $BM_3$. Note that when a Ta layer, for example, is adopted in place of a Ti layer, the wettability between the surface of the via hole H and Al becomes worse and white turbidity occurs in the Al conductive layer 143. Next, an Al conductive layer 143 is deposited on the second barrier metal layer 142 by thermal sputtering. In this way, the Al conductive layer 143 is formed in the via hole H. The thermal sputtering is performed at a temperature on the order of 400° C.

Figure 2H:
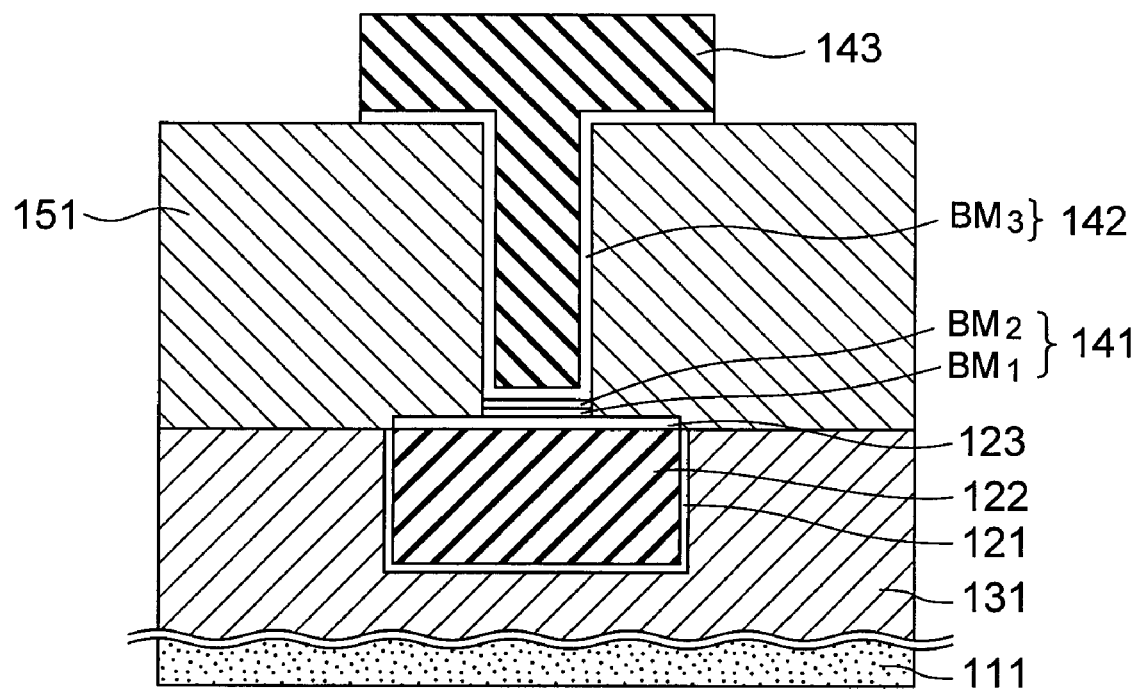

Next, as shown in FIG. 2H, the Al conductive layer 143 and the second barrier metal layer 142 are patterned by lithography and RIE. In this way, a via plug 202 buried in the via hole H is formed on the first line layer 201, and a second line layer 203 integrated with the via plug 202 is formed on the via plug 202.

The semiconductor device 101 of FIG. 1 is manufactured in this way. In this embodiment, the first barrier metal layer 141 and the second barrier metal layer 142 are formed between the top surface of the protective layer 123 and the bottom surface of the Al conductive layer 143. On the other hand, in this embodiment, the second barrier metal layer 142 is formed between the side surface of the via hole H and the side surface of the Al conductive layer 143, but the first barrier metal layer 141 is not formed there. For this reason, in this embodiment, it is possible to relatively increase the thickness of the barrier metal layer (141 and 142) on the bottom surface of the via plug 202, and to relatively decrease the thickness of the barrier metal layer (141) on the side surface of the via plug 202. Consequently, in this embodiment, it is possible to relatively easily prevent the barrier break and the unburying of the barrier metal layer at the same time. Consequently, it is possible to improve the reliability of the Cu line layer 122 and the Al conductive layer 143.

Figure 4:
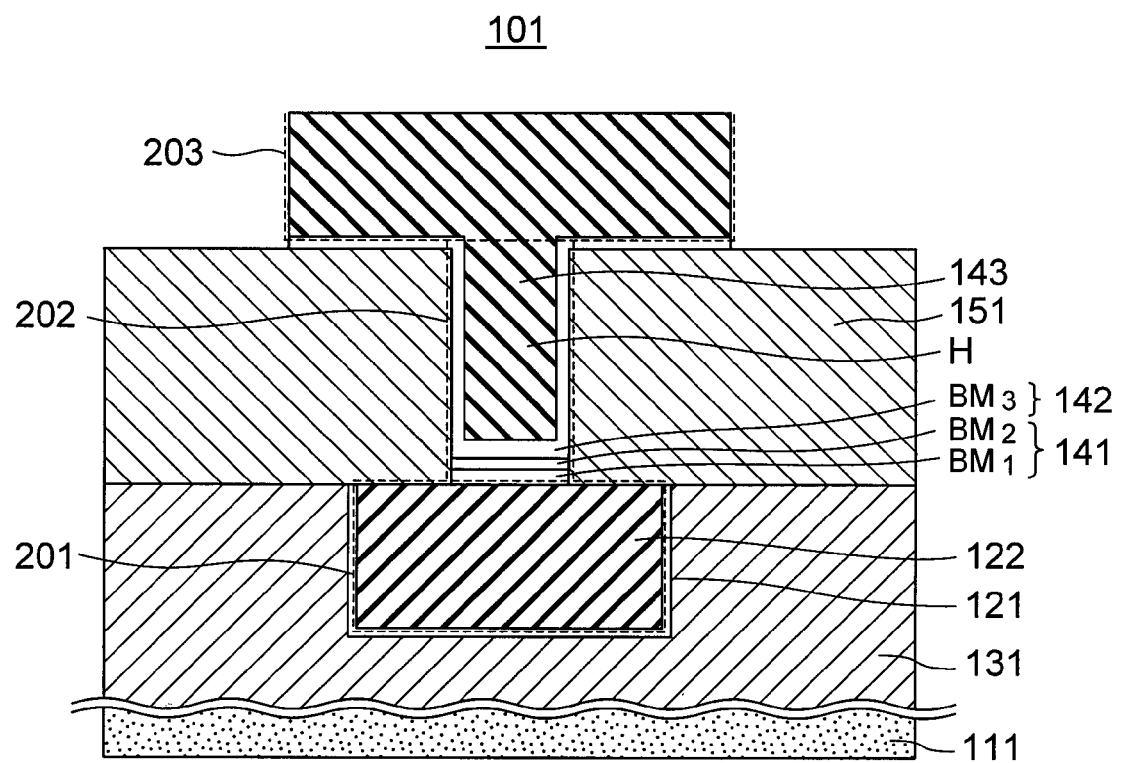
FIG. 4 is a side sectional view showing a semiconductor device of a first modification of the first embodiment.

In this embodiment, the CoWB layer 123 is formed on the top surface of the Cu line layer 122. Consequently, oxidation of Cu atoms contained in the Cu line layer 122 is suppressed and the reliability of the Cu line layer 122 is further improved. In this embodiment, as shown in FIG. 4, it is not always necessary that the CoWB layer 123 be formed on the top surface of the Cu line layer 122. In this case, it is unnecessary to deposit the CoWB layer 123, in the step shown in FIG. 2B. In the step shown in FIG. 2B, the first barrier metal layer 141 (Ti layer $BM_1$) is deposited on the Cu line layer 122 and the first inter layer dielectric 131. The first and second barrier metal layers 141 and 142 are formed between the top surface of the Cu line layer 122 and the bottom surface of the Al conductive layer 143. The second inter layer dielectric 151 and the first barrier metal layer 141 are formed directly on the Cu line layer 122. In the case of FIG. 4, it is preferred that the top surface of the Cu line layer 122 be silicidized in order to prevent Cu atoms from diffusing into the second inter layer dielectric 151.

Figure 5:
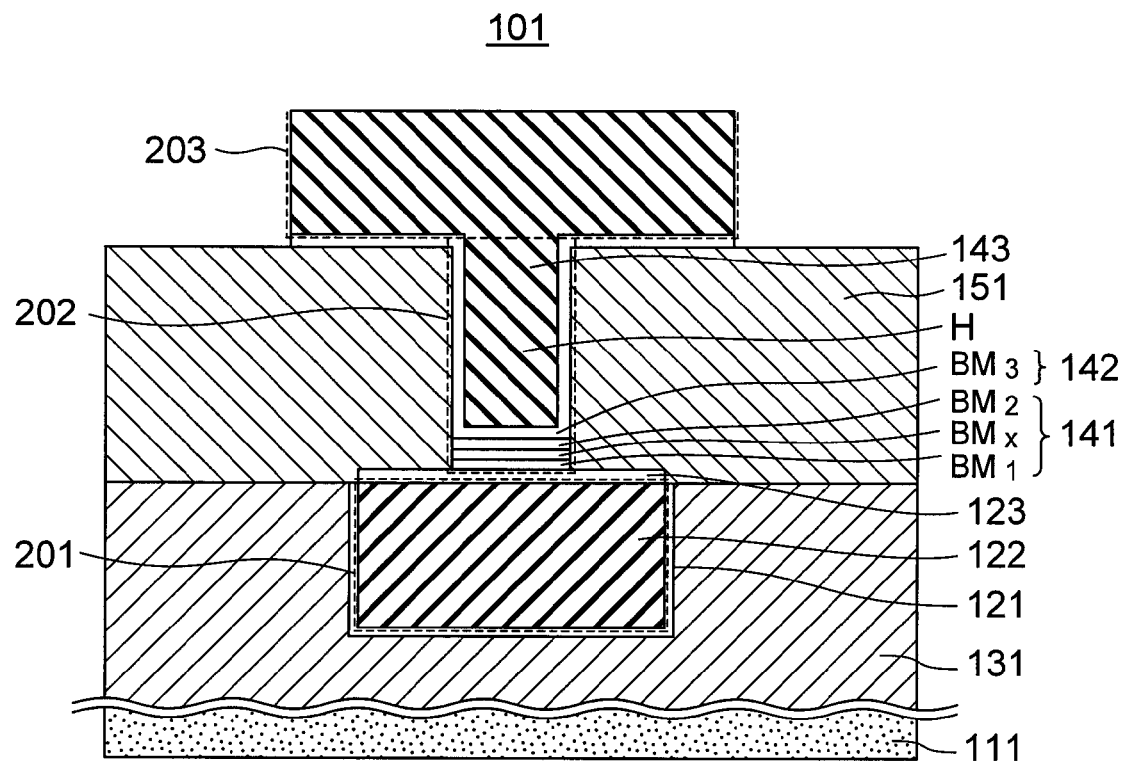
FIG. 5 is a side sectional view showing a semiconductor device of a second modification of the first embodiment.

In this embodiment, the second barrier metal layer 142 includes a Ti layer. Consequently, the wettability between the surface of the via hole and Al is improved. Furthermore, in this embodiment, the first barrier metal layer 141 includes a TiN layer. Consequently, diffusion of Cu atoms contained in the Cu line layer 122 and Al atoms contained in the Al conductive layer 143 is suppressed. In this embodiment, the thickness of the first barrier metal layer 141 becomes uniform in the wafer plane. In this embodiment, as shown in FIG. 5, a TiO layer $BM_x$ may be formed between the Ti layer $BM_1$ and the TiN layer $BM_2$ of the first barrier metal layer 141. Consequently, diffusion of Cu atoms contained in the Cu line layer 122 and Al atoms contained in the Al conductive layer 143 is further suppressed. In this case, in the step shown in FIG. 2B, the TiO layer $BM_x$ is deposited on the Ti layer $BM_1$ by exposure to the air or forced oxidation, after depositing the Ti layer $BM_1$. Subsequently, in the step shown in FIG. 2B, the TiN layer $BM_2$ is deposited on the TiO layer $BM_x$.

Figure 6:
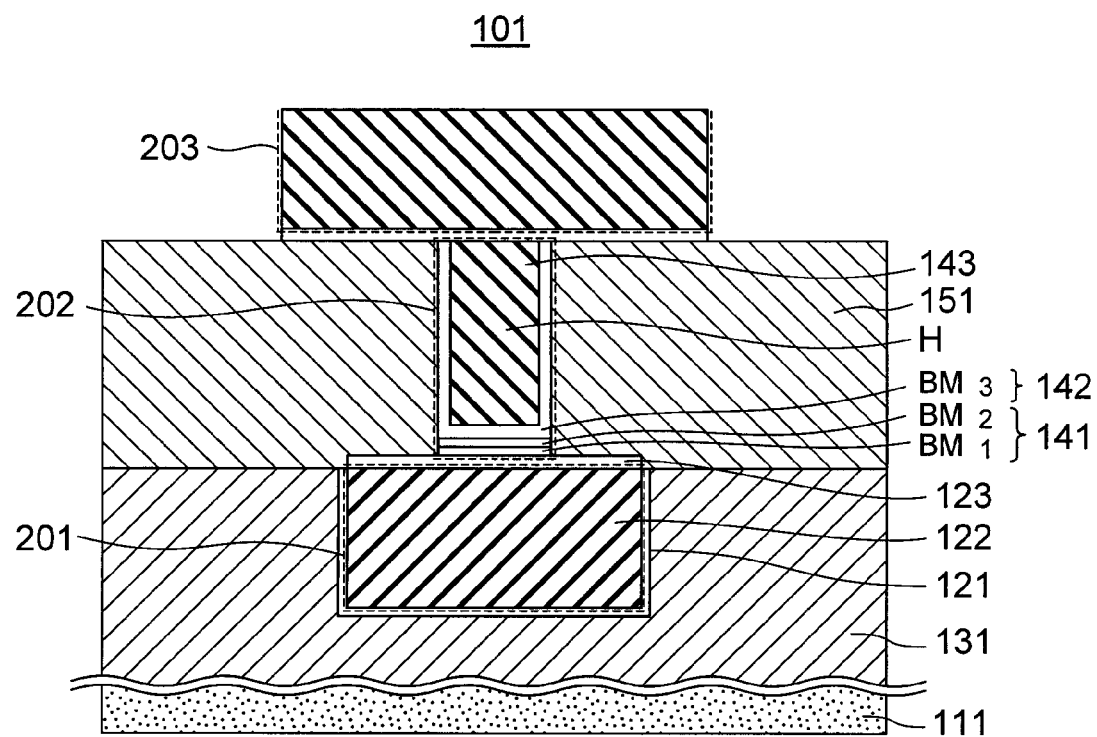
FIG. 6 is a side sectional view showing a semiconductor device of a third modification of the first embodiment.

In this embodiment, the Al conductive layer 143 constitutes the via plug 202 and the second line layer 203. Consequently, it becomes unnecessary to deposit a material that forms the second line layer 203 separately from a material that forms the via plug 202, and the manufacturing cost of the semiconductor device 101 is reduced. In this embodiment, as shown in FIG. 6, the second line layer 203 may be formed separately from the via plug 202. In this case, the second line layer 203 is not formed in the step shown in FIG. 2H, but the second line layer 203 is formed after the step shown in FIG. 2H.

A semiconductor device 101 of a second embodiment and a method of manufacturing the same will be described below. The second embodiment is a modification of the first embodiment. Therefore, for the second embodiment, differences from the first embodiment will be mainly described.

Second Embodiment

A side sectional view of the semiconductor device 101 of the second embodiment is shown in FIG. 1, similar to that of the first embodiment. The semiconductor device 101 of the second embodiment includes a substrate 111, a barrier metal layer 121, a Cu line layer 122, a protective layer 123, a first inter layer dielectric 131, a first barrier metal layer 141, a second barrier metal layer 142, an Al conductive layer 143, and a second inter layer dielectric 151. The Cu line layer 122 constitutes a first line layer 201, which is a Cu line layer. The first barrier metal layer 141, the second barrier metal layer 142, and the Al conductive layer 143 constitute a via plug 202. The Al conductive layer 143 further constitutes a second line layer 203, which is an Al line layer. The first line layer 201 and the second line layer 203 are electrically connected by the via plug 202. The first line layer 201 corresponds to a lower line layer of the via plug 202, and the second line layer 203 corresponds to an upper line layer of the via plug 202.

FIGS. 3A to 3J illustrate a manufacturing process of the semiconductor device 101 of the second embodiment shown in FIG. 1.

Figure 3A:
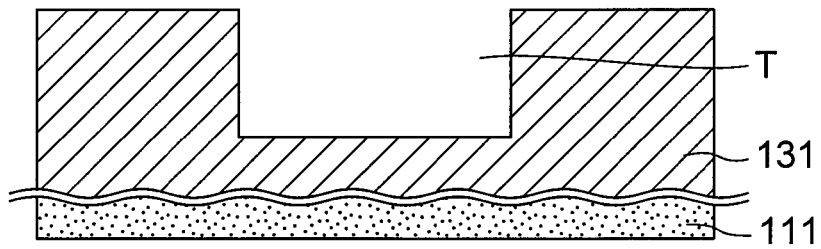
FIGS. 3A to 3J illustrate a manufacturing process of a semiconductor device of a second embodiment.

First, as shown in FIG. 3A, a first inter layer dielectric 131 is deposited above a substrate 111 by CVD. The substrate 111 in this case is a silicon substrate. The first inter layer dielectric 131 in this case is a TEOS layer. It is supposed that semiconductor elements such as transistors and capacitors are formed on the substrate 111. Next, a line trench T is formed on the surface of the first inter layer dielectric 131 by lithography and etching.

Figure 3B:
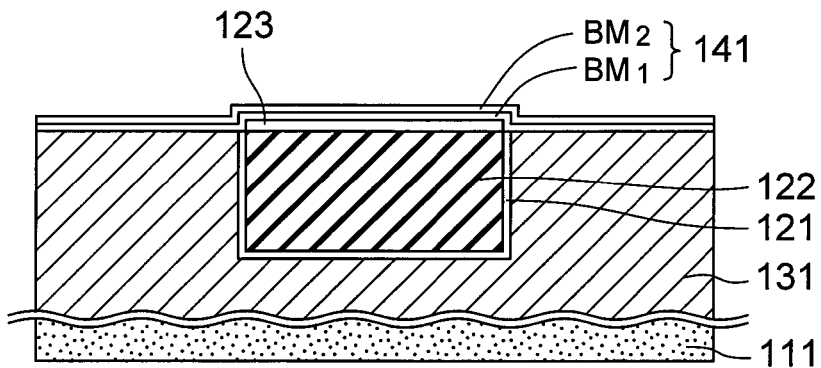

Next, as shown in FIG. 3B, a Ta layer 121 is deposited on the first inter layer dielectric 131 by sputtering. Consequently, the Ta layer (barrier metal layer) 121 is formed on a bottom surface and side surface of the line trench T. Next, a Cu seed layer is deposited on the Ta layer 121 by sputtering, and a Cu layer is deposited on the Cu seed layer by plating or the like. Consequently, the Cu line layer 122 is formed in the line trench T. Next, the Cu line layer 122 is planarized by CMP. In this way, a first line layer 201 buried in the line trench T is formed. Next, a CoWB layer 123 is selectively deposited on the Cu line layer 122 by plating or selective CVD. Consequently, the CoWB layer (protective layer) 123 is formed at least on a top surface of the Cu line layer 122. Next, a Ti layer $BM_1$ is deposited on the CoWB layer 123 and the first inter layer dielectric 131 by sputtering, and a TiN layer $BM_2$ is deposited on the Ti layer $BM_1$ by sputtering. In this way, a first barrier metal layer 141 (the Ti layer $BM_1$ and the TiN layer $BM_2$) is formed on the CoWB layer 123 and on the top surface of the first inter layer dielectric 131, before forming the via hole H for the via plug 202. The first barrier metal layer 141 is formed on the Cu line layer 122 via the CoWB layer 123.

Figure 3C:
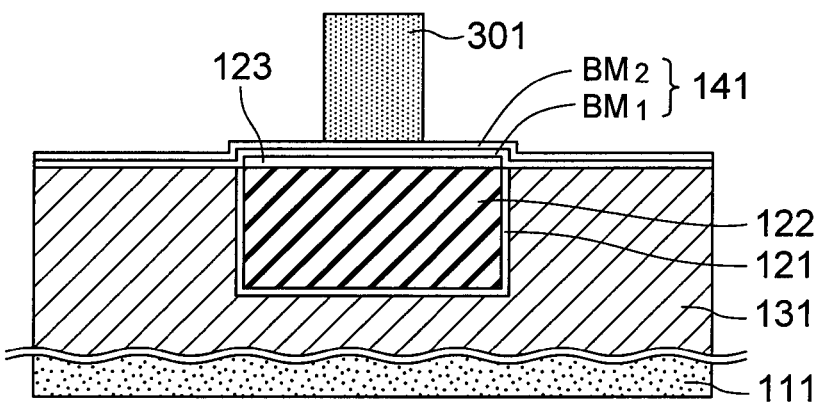

Next, a mask material 301 is deposited on the first barrier metal layer 141 by application. The mask material 301 can be selectively peeled off from the first barrier metal layer 141 and the first inter layer dielectric 131. The mask material 301 in this case is an SiN (silicon nitride) layer. The mask material 301 may be organic polyphenylene such as SILK (registered trademark). Next, the heat treatment of the substrate 111 is performed at 100° C. to 400° C. Next, a resist pattern is formed on the mask material 301 by lithography. In the lithography, an inverted mask of a via hole pattern is used. Next, as shown in FIG. 3C, the mask material 301 is etched by RIE.

Figure 3D:
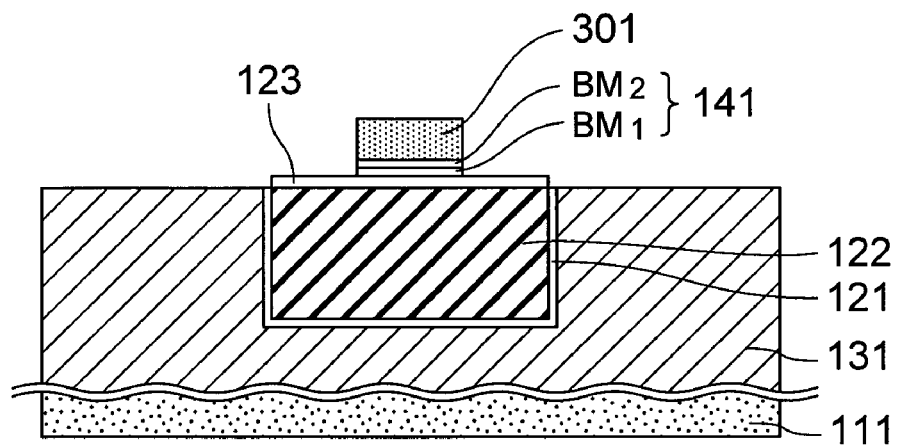

Next, as shown in FIG. 3D, the first barrier metal layer 141 is etched, and an ashing process is then performed. The etching is performed by ensuring a sufficient etching selectivity between the first barrier metal layer 141 and the CoWB layer 123. The ashing process is performed in an $O_2$ atmosphere at a temperature of 200° C. to 400° C. In this way, the first barrier metal layer 141 is partially removed, and a part of the first barrier metal layer 141 remains in a region where the via hole H is to be formed. In this embodiment, the CoWB layer 123 is provided mainly to suppress RIE damage to the Cu line layer 122 and to prevent oxidation of the Cu line layer 122 by the ashing process. Furthermore, the CoWB layer 123 has an effect of reducing line-to-line capacitance and suppressing poor electromigration of Cu. Next, etching reaction products (residues) of the mask material 301, the first barrier metal layer 141, and the CoWB layer 123 are removed with an inorganic or organic chemical liquid.

Figure 3E:
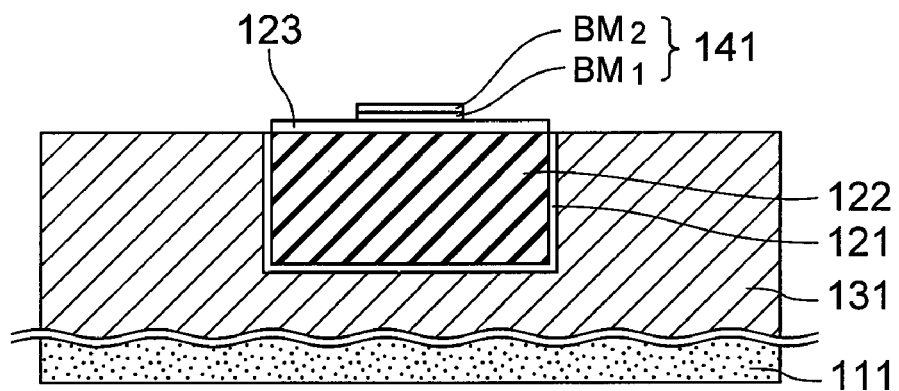

Next, as shown in FIG. 3E, an RIE process of the mask material 301 is performed, and an ashing process is then performed. In this way, the mask material 301 is removed, and a top surface of the first barrier metal layer 141 (a top surface of the TiN layer $BM_2$) is exposed.

Figure 3F:
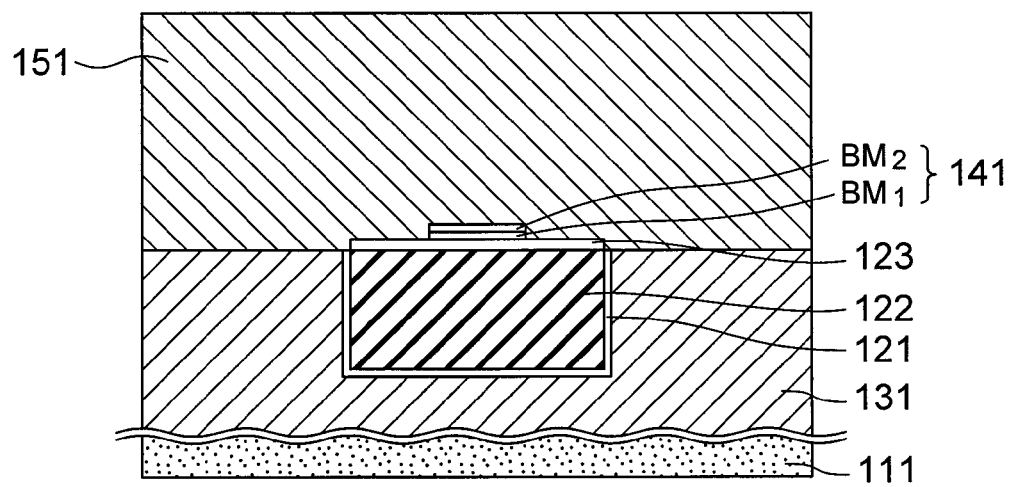

Next, as shown in FIG. 3F, a second inter layer dielectric 151 is deposited above the substrate 111 by CVD. Consequently, the second inter layer dielectric 151 is formed on the first inter layer dielectric 131 and the first barrier metal layer 141. The second inter layer dielectric 151 in this case is a TEOS layer. The second inter layer dielectric 151 is formed on the Cu line layer 122 via the CoWB layer 123, after forming the first barrier metal layer 141. Next, the second inter layer dielectric 151 is planarized by etching.

Figure 3G:
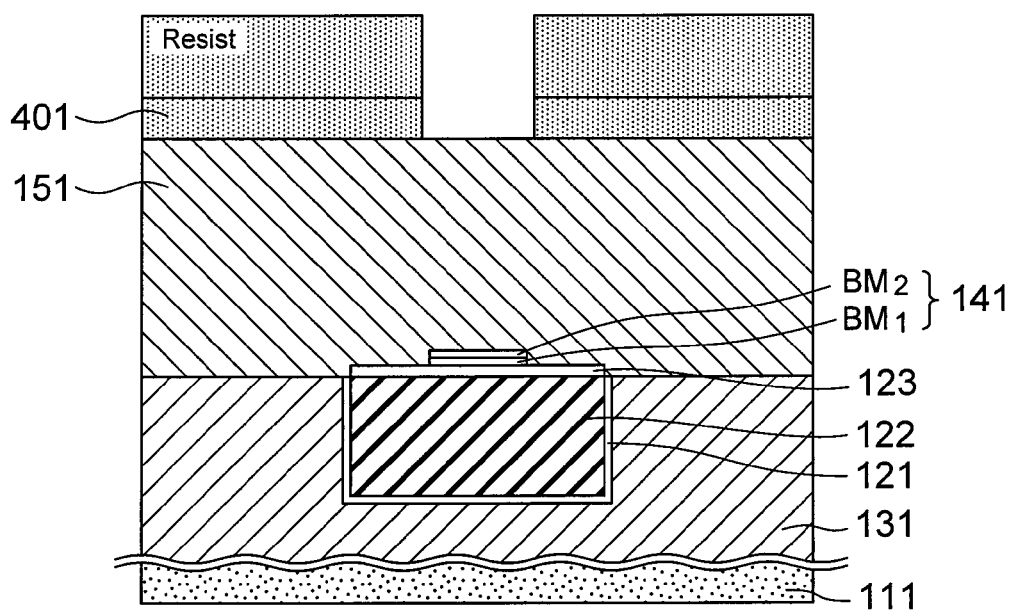

Next, an anti-reflection coating 401 is deposited on the second inter layer dielectric 151. Next, a resist pattern is formed on the anti-reflection coating 401 by lithography. In the lithography, a mask of a via hole pattern is used. Next, as shown in FIG. 3G, the anti-reflection coating 401 is etched.

Figure 3H:
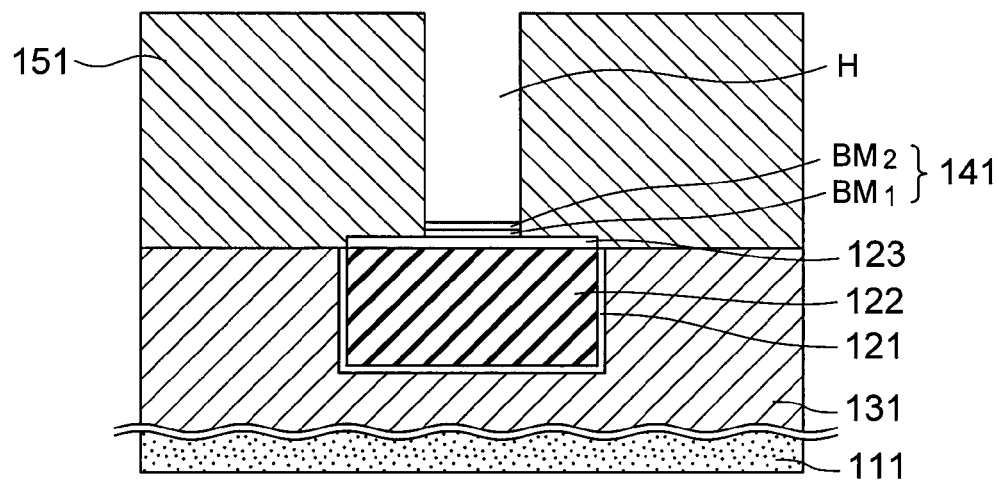
Figure 3:
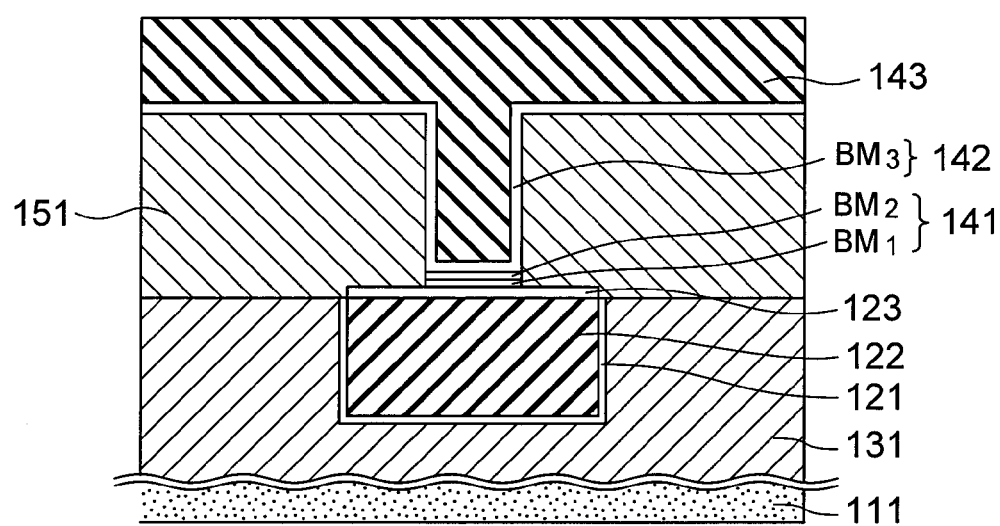

Next, as shown in FIG. 3H, the second inter layer dielectric 151 is removed by RIE and ashing. Consequently, there is provided a via hole H in which the top surface of the first barrier metal layer 141 (the top surface of the TiN layer $BM_2$) is exposed. The via hole H is formed in the second inter layer dielectric 151 on the Cu line layer 122, and a sidewall of the via hole H is constituted by the second inter layer dielectric 151. Next, etching reaction products (residues) of the second inter layer dielectric 151 are removed with an inorganic or organic chemical liquid.

Next, as shown in FIG. 3I, a Ti layer $BM_3$ is deposited on the second inter layer dielectric 151 by sputtering. In this way, a second barrier metal layer 142 (Ti layer $BM_3$) is formed on the top surface of the first barrier metal layer 141 (the top surface of the TiN layer $BM_2$) and the sidewall of the via hole H, after forming the via hole H for the via plug 202. Effects of the Ti layer BM₃ is described below. First, the Ti layer BM₃ has an effect of improving wettability between the surface of the via hole H and Al. Due to the presence of the Ti layer BM₃, the interface energy between the surface of the via hole H and Al is lowered, and the agglomeration of Al is suppressed. Second, the Ti layer BM₃ has an effect of suppressing the white turbidity of the Al conductive layer 143. The white turbidity of the Al conductive layer 143 is suppressed because the top surface of the Al conductive layer 143 becomes a (111) plane due to the effect of the Ti layer BM₃. Note that when a Ta layer, for example, is adopted in place of a Ti layer, the wettability between the surface of the via hole H and Al becomes worse and white turbidity occurs in the Al conductive layer 143. Next, an Al conductive layer 143 is deposited on the second barrier metal layer 142 by thermal sputtering. In this way, the Al conductive layer 143 is formed in the via hole H. The thermal sputtering is performed at a temperature on the order of 400° C.

Figure 3J:
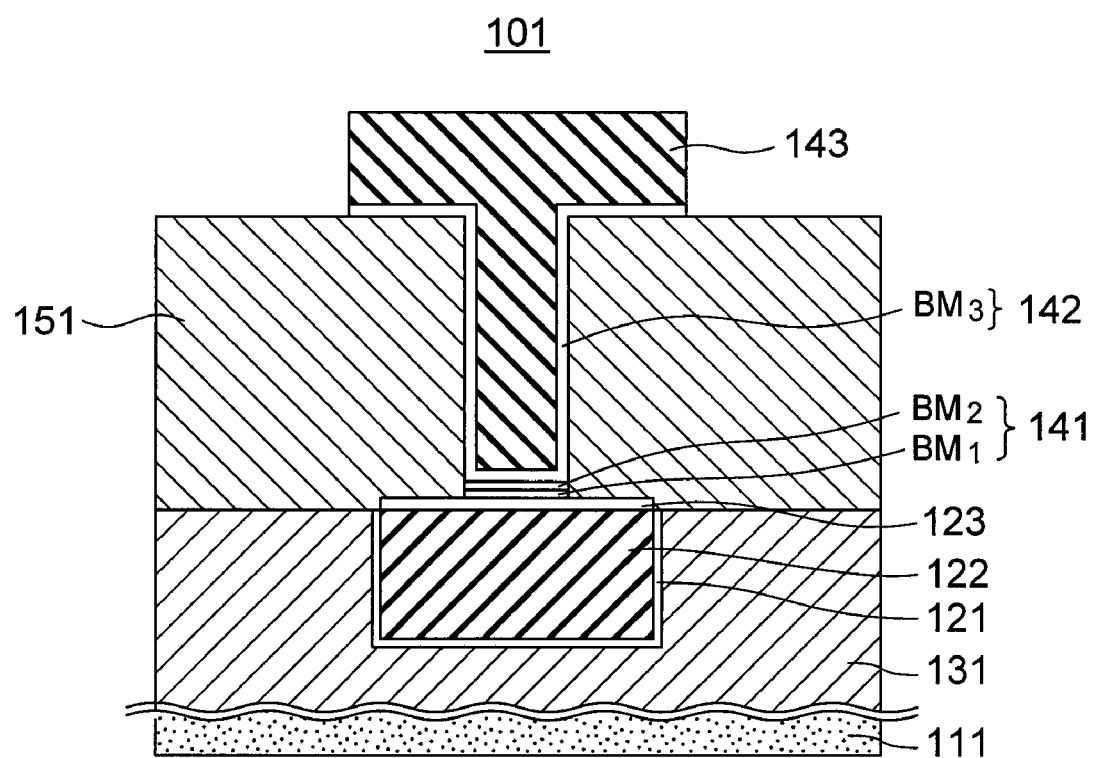

Next, as shown in FIG. 3J, the Al conductive layer 143 and the second barrier metal layer 142 are patterned by lithography and RIE. In this way, a via plug 202 buried in the via hole H is formed on the first line layer 201, and a second line layer 203 integrated with the via plug 202 is formed on the via plug 202.

A comparison is made between the first embodiment and the second embodiment.

In the first embodiment, as shown in FIG. 2E, the second inter layer dielectric 151 is formed under the condition that the mask material 301 is present on the top surface of the first barrier metal layer 141 (the top surface of the TiN layer BM₂). Furthermore, in the first embodiment, as shown in FIG. 2F, the mask material 301 is removed after forming the second inter layer dielectric 151. The via hole H is formed in this way.

In the second embodiment, as shown in FIG. 3F, the second inter layer dielectric 151 is formed under the condition that the top surface of the first barrier metal layer 141 (the top surface of the TiN layer BM₂) is exposed. Furthermore, in the second embodiment, as shown in FIG. 3H, the via hole H is opened in the second inter layer dielectric 151 after forming the second inter layer dielectric 151. The via hole H is formed in this way.

The semiconductor device 101 of FIG. 1 may be manufactured by the method shown in FIG. 2A to 2H or the method shown in FIG. 3A to 3J. However, the number of steps of the method shown in FIG. 2A to 2H is less than that of the method shown in FIG. 3A to 3J.

As described above, the embodiments of the present invention can improve the reliability of a line layer containing Cu and a via plug layer containing Al.

The invention claimed is:

1. A semiconductor device comprising:
   a line layer containing Cu (copper) and having a silicidized top surface;
   an inter layer dielectric formed on the line layer;
   a via hole formed in the inter layer dielectric on the line layer;
   a first barrier layer directly formed on the line layer in the via hole;
   a second barrier layer formed on the first barrier layer covering a top surface of the line layer in the via hole and formed on a sidewall of the via hole, the second barrier layer being contacted on the first barrier layer in a bottom direction of the via hole, and being contacted on the sidewall in a sidewall direction of the via hole; and
   a conductive layer formed on the second barrier layer and containing Al (aluminum).

2. The device according to claim 1, further comprising:
   a substrate;
   an inter layer dielectric formed above the substrate;
   a line trench formed in the inter layer dielectric formed above the substrate; and
   a barrier layer formed on a bottom surface and a side surface of the line trench and including a layer containing Ta (tantalum) and/or Ti (titanium),
   wherein the line layer is formed on the barrier layer so as to be buried in the line trench.

3. The device according to claim 1, wherein each of the first and second barrier layers includes a layer containing Ti (titanium).

4. The device according to claim 1, wherein the first barrier layer includes a Ti layer, and a TiN layer formed on the Ti layer.

5. The device according to claim 1, wherein the first barrier layer includes a Ti layer, a TiO layer formed on the Ti layer, and a TiN layer formed on the TiO layer.

6. The device according to claim 1, wherein the conductive layer constitutes a via plug provided on the line layer, and a further line layer provided on the via plug.

7. The device according to claim 1, wherein a top surface of the conductive layer is a (111) plane.

* * * * *